United States Patent [19]

Takeda

[11] Patent Number: 5,212,666

[45] Date of Patent: May 18, 1993

[54] MEMORY APPARATUS HAVING FLEXIBLY DESIGNED MEMORY CAPACITY

[75] Inventor: Koji Takeda, Suwa, Japan

[73] Assignee: Seiko Epson Corporation, Japan

[21] Appl. No.: 551,449

[22] Filed: Jul. 10, 1990

[30] Foreign Application Priority Data

Jul. 10, 1989 [JP] Japan .................................. 1-177375
Aug. 21, 1989 [JP] Japan .................................. 1-214414

[51] Int. Cl.$^5$ .......................... G11C 8/00; G06F 12/00
[52] U.S. Cl. .................. 365/230.03; 395/425; 395/400; 365/51; 365/63
[58] Field of Search ................ 365/230.03, 63, 51, 365/189.01; 395/425, 400; 364/DIG. 1, 245.1, 245.2

[56] References Cited

U.S. PATENT DOCUMENTS 4,592,022  5/1986  Shimohigashi et al. ............. 365/189
4,633,443 12/1986  Childers ............................... 365/203
4,893,280  1/1990  Gelsomini et al. ............. 365/189.06 X

FOREIGN PATENT DOCUMENTS 113730  8/1978  Japan .

Primary Examiner—Alyssa H. Bowler
Attorney, Agent, or Firm—W. Douglas Carothers, Jr.

[57] ABSTRACT

A memory apparatus has a $W(1+J/N)$ (words)$\times D$ (bits) configuration employing $(N+J)$ semiconductor memory units having $(N+J)$ $W$ (words)$\times B$ (bits) semiconductor memory elements wherein $N=D/B=2^{d-b}$ and J is a positive integer wherein $J<N$; $W=2^w$ and w is a positive integer; and $B=2^b$ where b is zero or a positive integer satisfying $b<d$. For example, five 256K$\times$4 1M DRAMs are employed so that four out of five DRAMs always correspond to access from a microprocessor. Furthermore, a 640-Kbyte memory address space is equally divided into five 128-Kbyte memory address areas and the correspondence between the 128-Kbyte memory address areas and four out of the five DRAMs is regularly determined in turn, thereby constituting a 640-Kbyte memory apparatus (320 Kwords$\times$16 bits) employing only 1M DRAMs. More particularly, a memory capacity can be set in relatively small units, i.e., in units of $W \cdot J/N$ words$\times D$ bits by employing only semiconductor memory units of a single type.

8 Claims, 13 Drawing Sheets

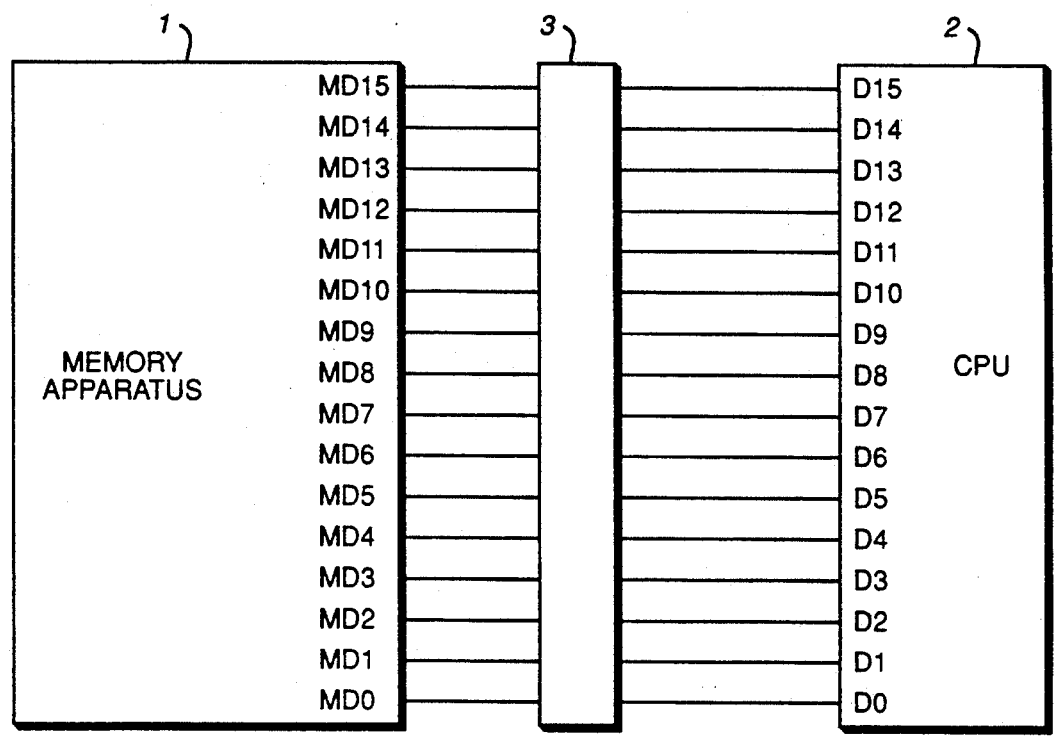
FIG._1A

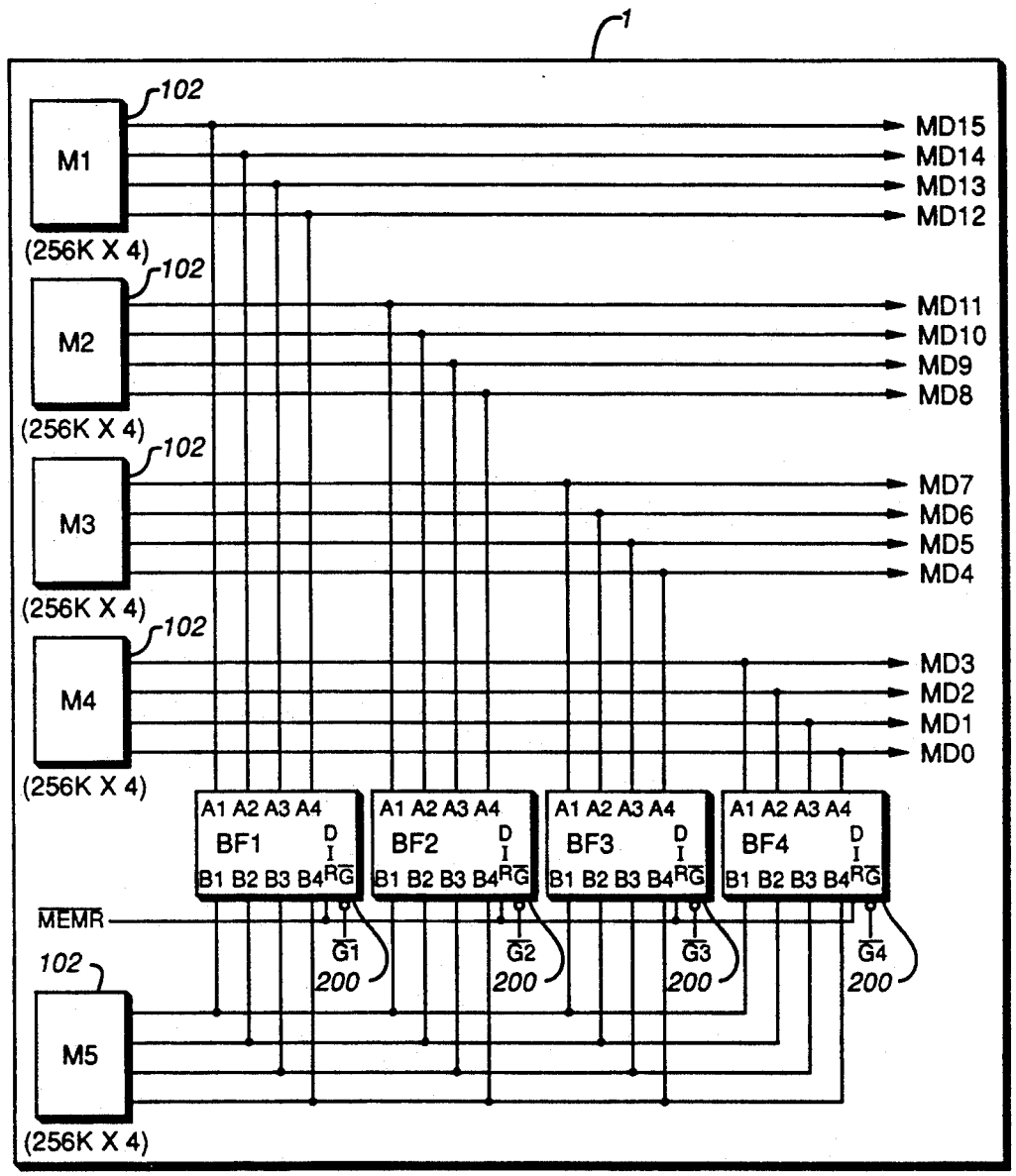
FIG._1B

| | | MEMORY ADDRESSES OF MICROPROCESSOR | | | | |
|---|---|---|---|---|---|---|
| | | $A_1$ | $A_2$ | $A_3$ | $A_4$ | $A_5$ |
| | | 00000H ~ 1FFFFH | 20000H ~ 3FFFFH | 40000H ~ 5FFFFH | 60000H ~ 7FFFFH | 80000H ~ 9FFFFH |
| DRAM | M1 | X | O | O | O | O |
| | M2 | O | X | O | O | O |
| | M3 | O | O | X | O | O |
| | M4 | O | O | O | X | O |
| | M5 | O | O | O | O | X |
| BUFFERS | $\overline{G1}$ (BF 1) | L | H | H | H | H |
| | $\overline{G1}$ (BF 2) | H | L | H | H | H |
| | $\overline{G1}$ (BF 3) | H | H | L | H | H |
| | $\overline{G1}$ (BF 4) | H | H | H | L | H |

O : RESPOND

X : NON-RESPOND

H : HIGH LEVEL

L : LOW LEVEL

FIG._1C

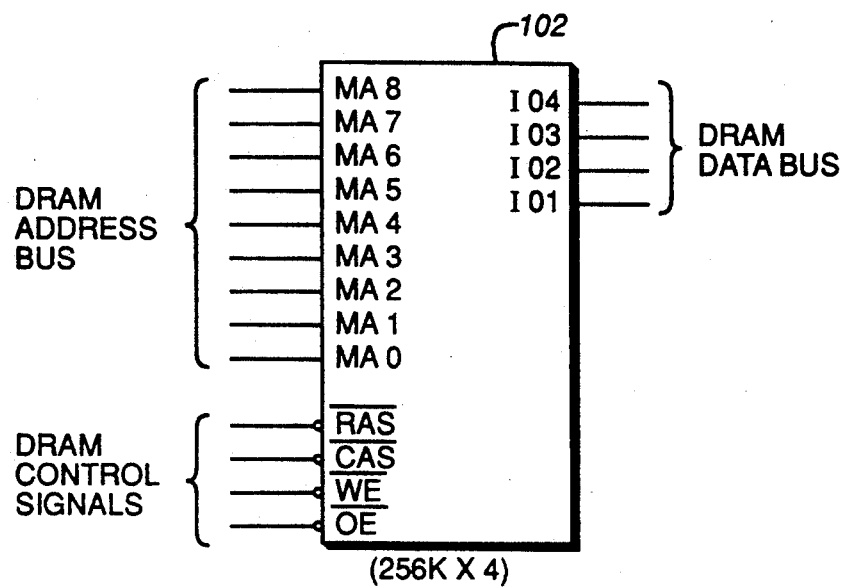
FIG._1D
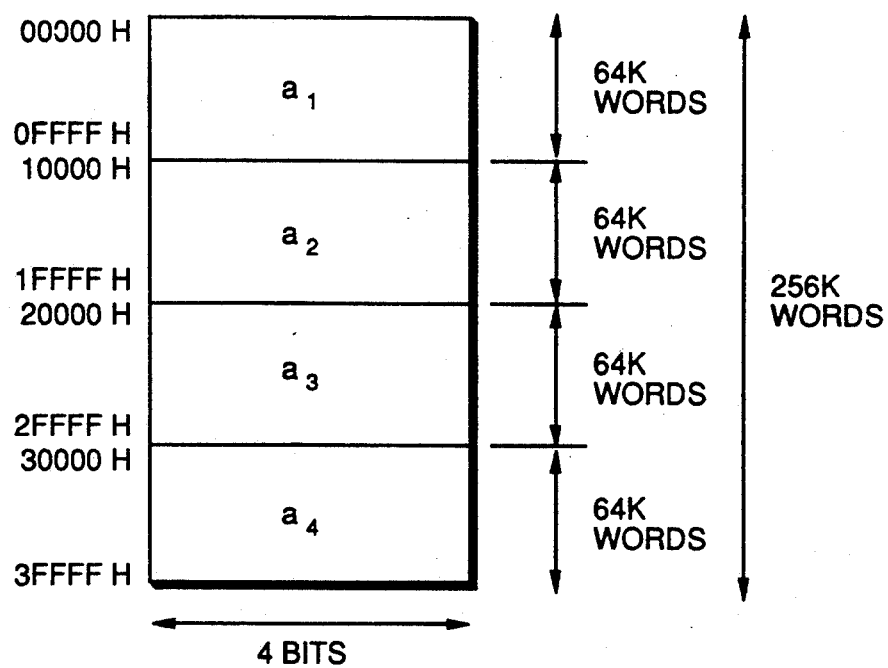
FIG._1E

| DRAM \ ADDRESS AREA | $A_1$ | $A_2$ | $A_3$ | $A_4$ | $A_5$ |
|---|---|---|---|---|---|
| M1 |  | $D1:a_2$ | $D1:a_3$ | $D1:a_4$ | $D1:a_1$ |
| M2 | $D2:a_1$ |  | $D2:a_3$ | $D2:a_4$ | $D2:a_2$ |
| M3 | $D3:a_1$ | $D3:a_2$ |  | $D3:a_4$ | $D3:a_3$ |
| M4 | $D4:a_1$ | $D4:a_2$ | $D4:a_3$ |  | $D4:a_4$ |
| M5 | $D1:a_1$ | $D2:a_2$ | $D3:a_3$ | $D4:a_4$ |  |

D1~D4 : MEMORY DATA BUS (MD15~MD0)

$\begin{cases} D1 : MD15 \sim MD12 \\ D2 : MD11 \sim MD8 \\ D3 : MD7 \sim MD4 \\ D4 : MD3 \sim MD0 \end{cases}$ $a_1 \sim a_4$ : DIVIDED ADDRESS AREAS OF DRAMS $\begin{cases} a_1 : 00000H \sim 0FFFFH \\ a_2 : 10000H \sim 1FFFFH \\ a_3 : 20000H \sim 2FFFFH \\ a_4 : 30000H \sim 3FFFFH \end{cases}$

*FIG._1F*

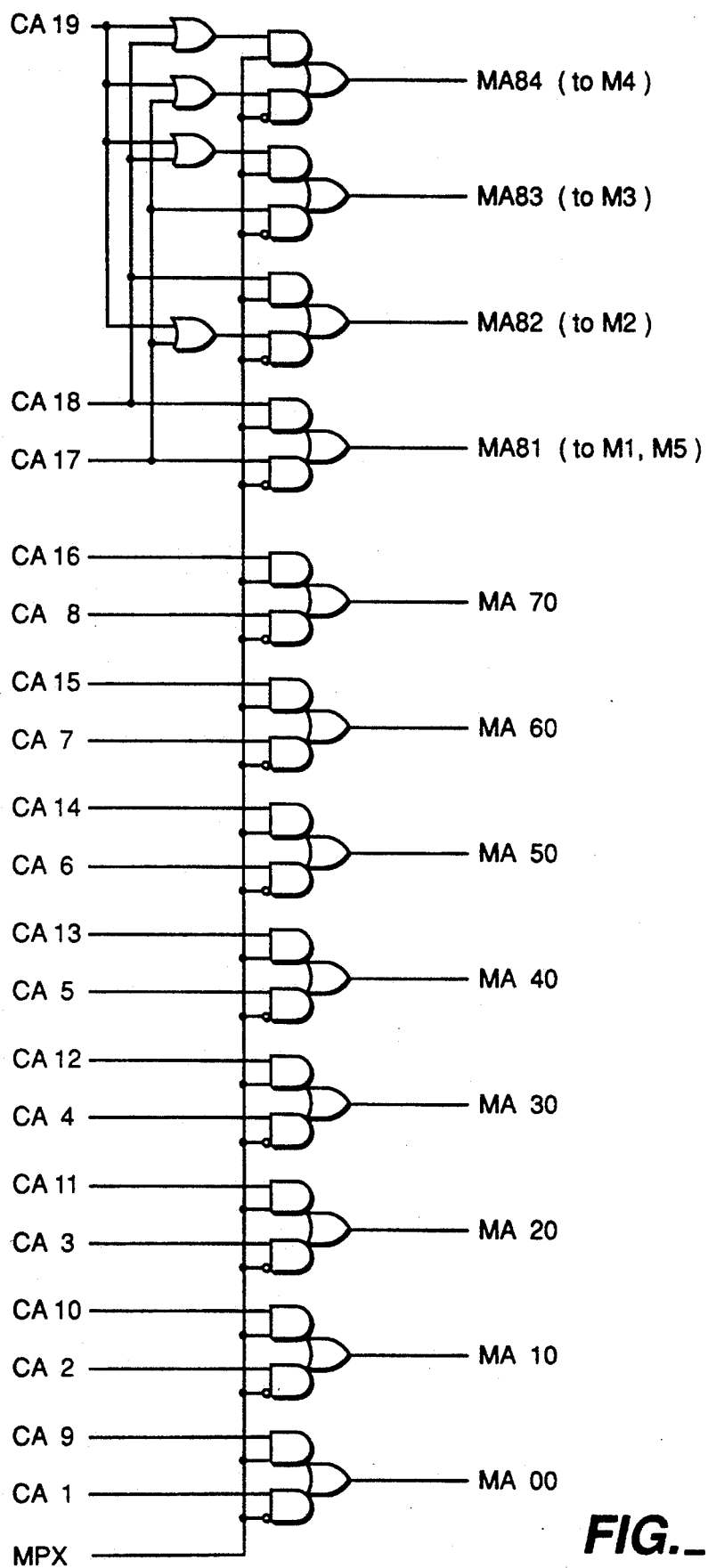
FIG._1G-1

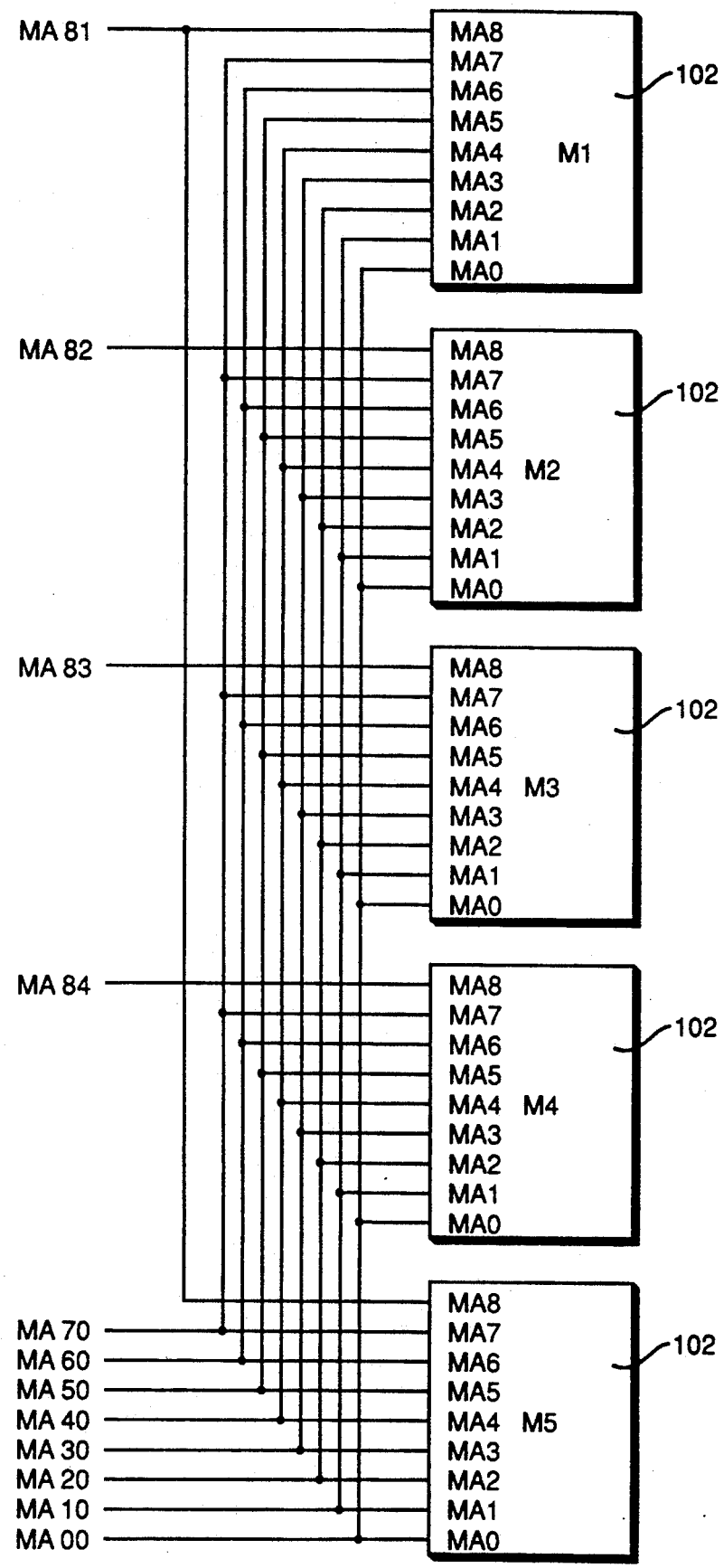
FIG._1G-2

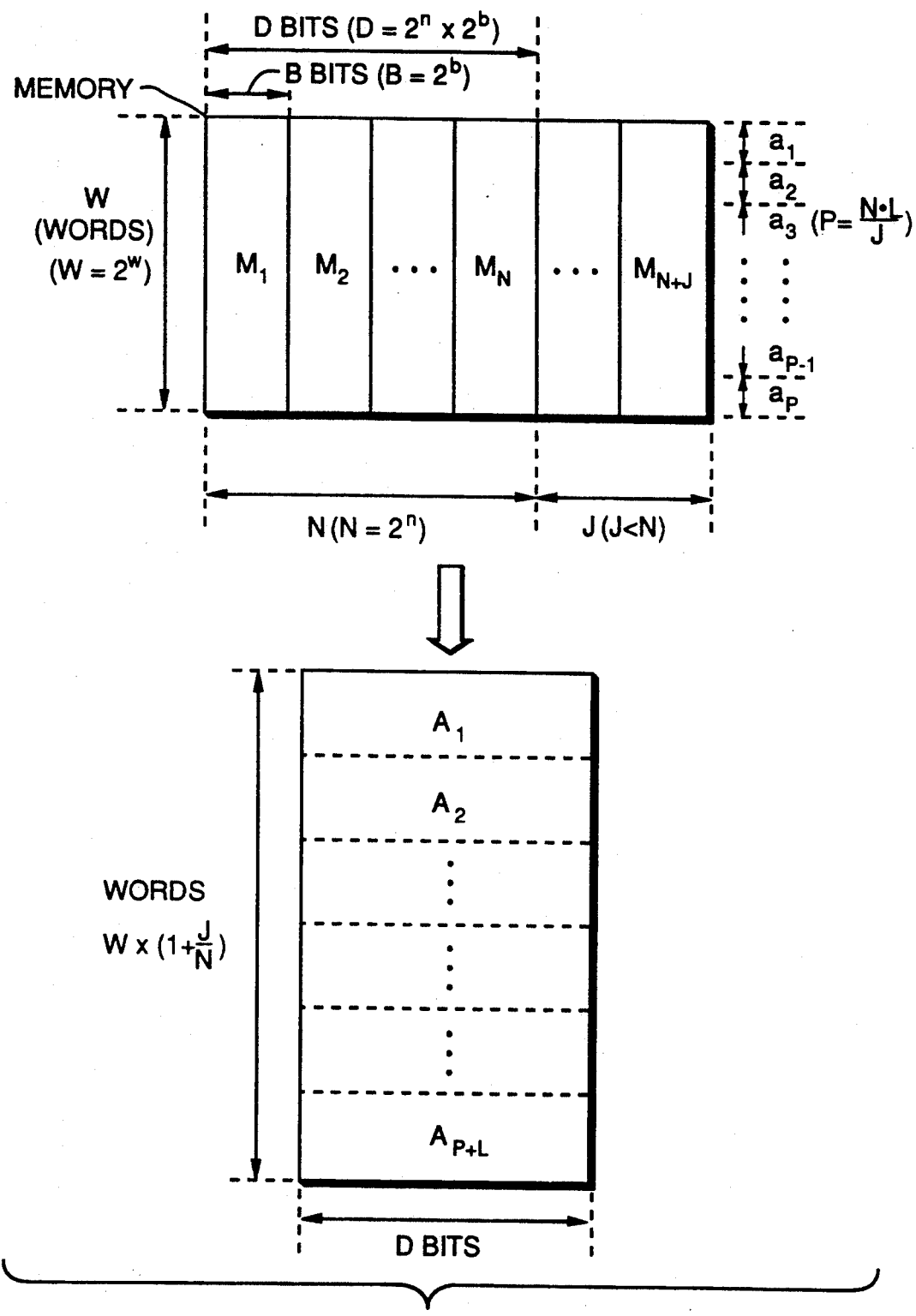
FIG._1H

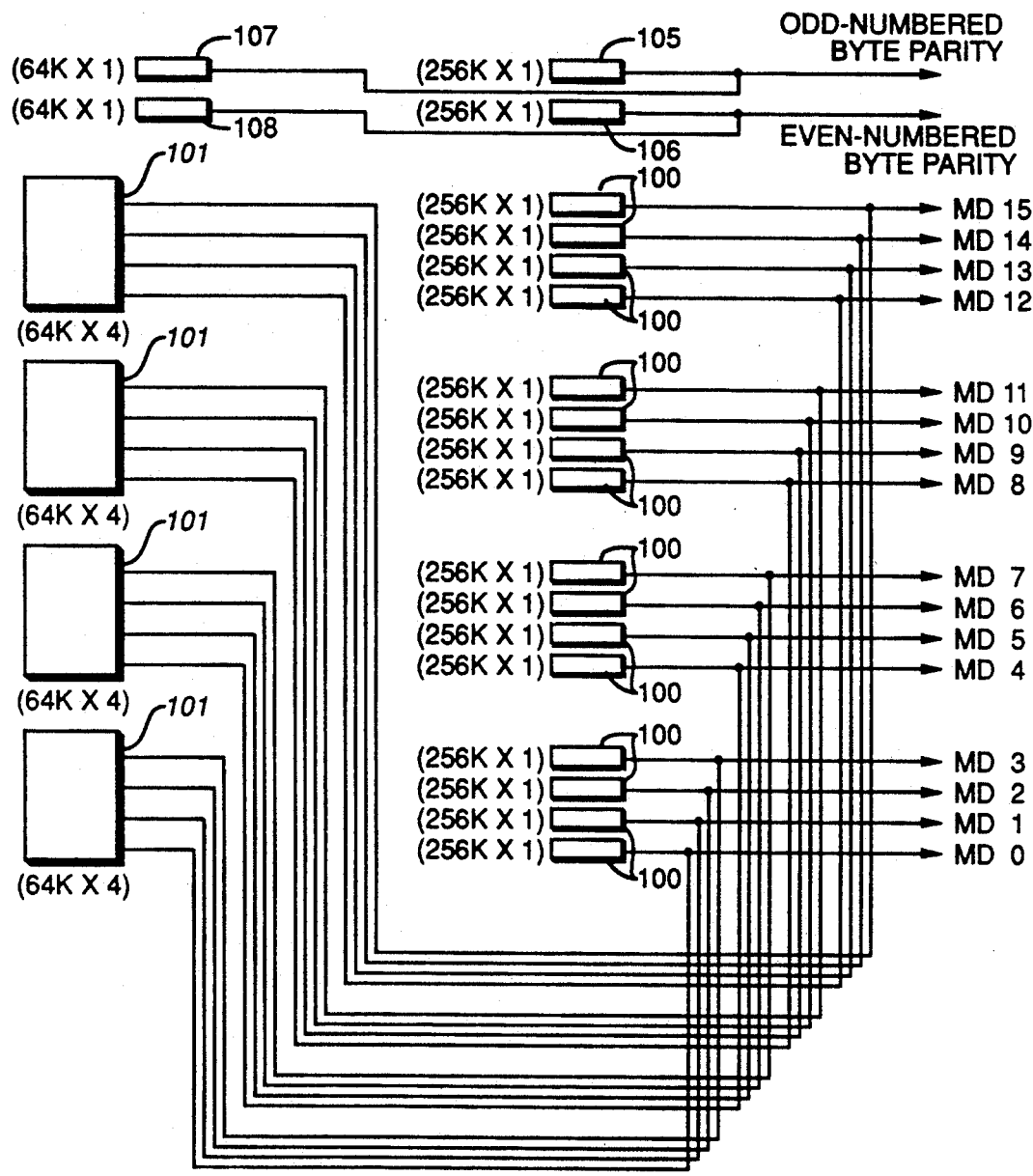
FIG._2
*(PRIOR ART)*

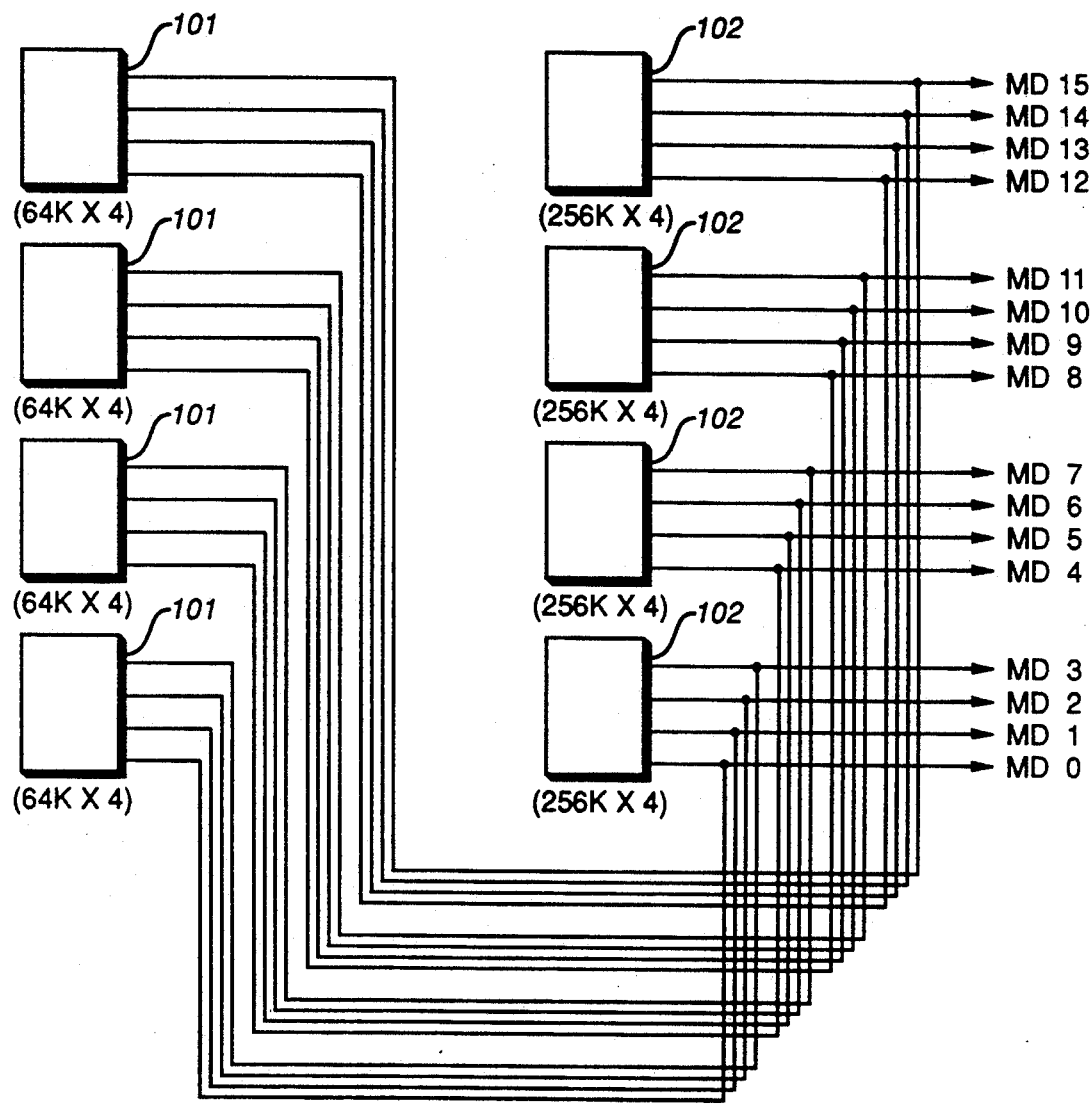
FIG._3
*(PRIOR ART)*

| ADDRESS AREA / DRAM | A₁ | A₂ | A₃ | A₄ | A₅ | A₆ |
|---|---|---|---|---|---|---|
| M1 | | | D1:a₃ | D1:a₄ | D1:a₁ | D1:a₂ |
| M2 | | | D2:a₃ | D2:a₄ | D2:a₁ | D2:a₂ |
| M3 | D3:a₁ | D3:a₂ | | | D3:a₃ | D3:a₄ |
| M4 | D4:a₁ | D4:a₂ | | | D4:a₃ | D4:a₄ |
| M5 | D1:a₁ | D1:a₂ | D3:a₃ | D3:a₄ | | |
| M6 | D2:a₁ | D2:a₂ | D4:a₃ | D4:a₄ | | |

$A_1$: 00000H~1FFFFH
$A_2$: 20000H~3FFFFH
$A_3$: 40000H~5FFFFH
$A_4$: 60000H~7FFFFH
$A_5$: 80000H~9FFFFH
$A_6$: E0000H~FFFFFH

D1: MD15~MD12
D2: MD11~MD8
D3: MD7~MD4
D4: MD3~MD0

$a_1$: 00000H~0FFFFH
$a_2$: 10000H~1FFFFH
$a_3$: 20000H~2FFFFH
$a_4$: 30000H~3FFFFH

| ADDRESS AREA / DRAM | A₁ | A₂ | A₃ |
|---|---|---|---|
| M1 | | D1:a₂ | D1:a₁ |
| M2 | | D2:a₂ | D2:a₁ |
| M3 | D3:a₁ | | D3:a₂ |
| M4 | D4:a₁ | | D4:a₂ |
| M5 | D1:a₁ | D3:a₂ | |
| M6 | D2:a₁ | D4:a₂ | |

$A_1$: 00000H~1FFFFH
$A_2$: 20000H~3FFFFH
$A_3$: 40000H~5FFFFH

D1: MD15~MD12
D2: MD11~MD8
D3: MD7~MD4
D4: MD3~MD0

$a_1$: 00000H~1FFFFH
$a_2$: 20000H~3FFFFH

ADDRESS AREA

| DRAM | $A_1$ | $A_2$ | $A_3$ | $A_4$ | $A_5$ | $A_6$ | $A_7$ |
|---|---|---|---|---|---|---|---|
| M1 | | $D1:a_2$ | $D1:a_3$ | $D1:a_4$ | $D1:a_1$ | | |
| M2 | | | $D2:a_3$ | $D2:a_4$ | $D2:a_1$ | $D2:a_2$ | |
| M3 | | | | $D2:a_4$ | $D3:a_1$ | $D3:a_2$ | $D3:a_3$ |
| M4 | $D4:a_1$ | | | | $D4:a_1$ | $D4:a_2$ | $D4:a_3$ |
| M5 | $D1:a_1$ | $D4:a_2$ | | | | $D1:a_2$ | $D1:a_3$ |
| M6 | $D2:a_1$ | $D2:a_2$ | $D4:a_3$ | | | | $D2\ a_4$ |
| M7 | $D3:a_1$ | $D3:a_2$ | $D3:a_3$ | $D4:a_4$ | | | |

$\begin{cases} A_1 : 00000H \sim 1FFFFH \\ A_2 : 20000H \sim 3FFFFH \\ A_3 : 40000H \sim 5FFFFH \\ A_4 : 60000H \sim 7FFFFH \\ A_5 : 80000H \sim 9FFFFH \\ A_6 : C0000H \sim DFFFFH \\ A_7 : E0000H \sim FFFFFH \end{cases}$ $\begin{cases} a_1 : 00000H \sim 0FFFFH \\ a_2 : 10000H \sim 1FFFFH \\ a_3 : 20000H \sim 2FFFFH \\ a_4 : 30000H \sim 3FFFFH \end{cases}$ $\begin{cases} D1 : MD15 \sim MD12 \\ D2 : MD11 \sim MD8 \\ D3 : MD7 \sim MD4 \\ D4 : MD3 \sim MD0 \end{cases}$

FIG._6

DATA WIDTH OF MEMORY APPARATUS

| | MEMORY DEVICE | MEMORY CAPACITY | |
|---|---|---|---|
| | | PRIOR ART (BYTES) | PRESENT INVENTION (BYTES) |
| 16 BITS | 1M (256K x 4) | 512K, 1M, 1.5M, 2.0M (UNITS OF 512K) | 512K, 640K, 768K, 896K, 1M (UNITS OF 128K) |
| 16 BITS | 1M (1M x 1) | 2M, 4M, 6M, 8M (UNITS OF 2M) | 2M, $2\frac{1}{8}$M, $2\frac{2}{8}$M, $2\frac{3}{8}$M (UNITS OF 128K) |
| 16 BITS | 1M (128K x 8) | 256K, 512K, 768K, 1M (UNITS OF 256K) | 256K, 384K, 512K, 640K (UNITS OF 128K) |
| 32 BITS | 1M (256K x 4) | 1M, 2M, 3M, 4M (UNITS OF 1M) | 1M, $1\frac{1}{8}$M, $1\frac{2}{8}$M, $1\frac{3}{8}$M (UNITS OF 128K) |
| 32 BITS | 1M (1M x 1) | 4M, 8M, 12M, 16M (UNITS OF 4M) | 4M, $4\frac{1}{8}$M, $4\frac{2}{8}$M, $4\frac{3}{8}$M (UNITS OF 128K) |
| 32 BITS | 1M (128K x 8) | 512K, 1M, 1.5M, 2M (UNITS OF 512K) | 512K, 640K, 768K, 896K, 1M (UNITS OF 128K) |
| 32 BITS | 1M (1K x 4) | 4M, 8M, 12M, 16M (UNITS OF 4M) | 4M, 4.5M, 5M, 5.5M (UNITS OF 512K) |
| 32 BITS | 1M (4M x 1) | 16M, 32M, 48M, 64M (UNITS OF 16M) | 16M, 16.5M, 17M, 17.5M (UNITS OF 512K) |
| 32 BITS | 4M (512K x 8) | 2M, 4M, 6M, 8M (UNITS OF 2M) | 2M, 2.5M, 3M, 3.5M (UNITS OF 512K) |

*FIG._7*

MEMORY APPARATUS HAVING FLEXIBLY DESIGNED MEMORY CAPACITY

BACKGROUND OF THE INVENTION

This invention relates generally to a memory apparatus for a personal computer and and more particularly to a memory apparatus comprising a plurality of commercially available semiconductor memory units which are configured to provide a designated memory size or capacity.

A memory apparatus having a 16-bit data bus width can be comprised of a plurality of semiconductor elements or units of identical structure. For example, a 256K (Kwords)×16 bit (512 Kbytes) memory apparatus can be comprised of four 256K×4 bit semiconductor memory units, a 512K×16 bit (1 Mbyte) memory apparatus can be comprised of 8 such memory units, a 768K×16 bits (1.5 Mbytes) memory apparatus can be comprised of 12 such memory units, and a 1024K×16 bit (2 Mbytes) memory apparatus can be comprised of 16 such memory units. In these cases, each time the number of memory units is increased by four, the memory capacity is increased in units of 512 Kbytes.

For example, when sixteen 1 Meg (Mwords)×1 bit semiconductor memory units are employed, a memory apparatus having a memory capacity of 2 Mbytes can be achieved. In this case, each time the number of semiconductor memory units is increased by 16, the memory capacity is increased in units of 2 Mbytes.

In the forgoing manner, a memory apparatus can be designed as a plurality of semiconductor memory units all of the same type. Typical memory apparatus are summarized in Table 1 below.

TABLE 1

| Data Bus Width | Type of Memory Element Used | Required Number of Memory Elements | Capacity of Memory Apparatus |
| --- | --- | --- | --- |
| 32 Bits | 128 Kwords × 8 Bits | Integer Multiple of 4 | Integer Multiple of 512 Kbytes |
| 32 Bits | 256 Kwords × 4 Bits | Integer Multiple of 8 | Integer Multiple of 1 Mbyte |
| 32 Bits | 1 Mword × 1 Bit | Integer Multiple of 32 | Integer Multiple of 4 Mbytes |
| 32 Bits | 512 Kwords × 8 Bits | Integer Multiple of 4 | Integer Multiple of 2 Mbytes |
| 32 Bits | 1 Mword × 4 Bits | Integer Multiple of 8 | Integer Multiple of 4 Mbytes |
| 32 Bits | 4 Mwords × 1 Bit | Integer Multiple of 32 | Integer Multiple of 16 Mbytes |
| 16 Bits | 128 Kwords × 8 Bits | Integer Multiple of 2 | Integer Multiple of 256 Kbytes |
| 16 Bits | 256 Kwords × 4 Bits | Integer Multiple of 4 | Integer Multiple of 512 Kbytes |
| 16 Bits | 1 Mword × 1 Bit | Integer Multiple of 16 | Integer Multiple of 2 Mbytes |
| 16 Bits | 512 Kwords × 8 Bits | Integer Multiple of 2 | Integer Multiple of 1 Mbyte |
| 16 Bits | 1 Mword × 4 Bits | Integer Multiple of 4 | Integer Multiple of 2 Mbytes |
| 16 Bits | 4 Mwords × 1 Bit | Integer Multiple of 16 | Integer Multiple of 8 Mbytes |
| 8 Bits | 128 Kwords × 8 Bits | Integer Multiple of 1 | Integer Multiple of 128 Kbytes |
| 8 Bits | 256 Kwords × 4 Bits | Integer Multiple of 2 | Integer Multiple of 256 Kbytes |
| 8 Bits | 1 Mword × 1 Bit | Integer Multiple of 8 | Integer Multiple of 1 Mbyte |

However, as can be understood from the above description and the content of Table 1, when a memory apparatus is constituted by using a plurality of semiconductor memory units of the same type, the capacity of the memory apparatus is limited to an integer multiple of a minimum capacity in accordance with its data bus width and combinations of semiconductor memory units employed.

For example, when a memory apparatus for a microprocessor having a 16-bit data bus width is to be formed by 256K×4 bit memory units, if four memory units are employed, a 512-Kbytes memory apparatus can be arranged. However, since the next largest memory capacity is 1 Mbyte using eight memory units, an intermediate memory capacity of 640 Kbytes cannot be obtained.

At present, a value "640 Kbytes" is a very significant memory size. More specifically, as an operating system for existing personal computers, the disk operating system (DOS) is most widely used and DOS requires 640 Kbytes for the standard main memory. Therefore, a memory apparatus having a memory capacity of exactly 640 Kbytes is required. In practice, almost all presently commercially available personal computers are equipped with 640-Kbyte main memories. The 640-Kbyte memory apparatus, however, cannot be constituted by a combination of semiconductor memory units of the same type but is formed by combining two or more types of semiconductor memory units.

More particularly, in order to comprise a 640-Kbyte memory apparatus, sixteen 256K×1 bit, 256-Kbit DRAMs (hereinafter referred to as 256K×1, 256K DRAMs) and four 64K×4 bit, 256-Kbit DRAMs (hereinafter referred to as 64K×4, 256K DRAMs) are employed, as illustrated in FIG. 2. This is because 256K DRAMs are most advantageous in terms of cost and are of ample supply. In FIG. 2, the 256K×1, 256K DRAMs are indicated by reference numeral 100 and the 64K×4,256K DRAMs are indicated by reference numeral 101. It is to be noted that FIG. 2 only illustrates connections of data terminals of the DRAMs and does not particularly show address and control terminals, such as, for example, RAS, CAS, and WE signals. In this connection, the connections of the data terminals are important relative to the understanding of the present invention, but the connections of other terminals relative to these DRAMs are not important to the understanding and employment of this invention and are already readily understood by those who are skilled in the art relative to the design of personal computers. Therefore, description and reference to these other DRAM terminal connections are not necessary to the description of this invention and are omitted.

In FIG. 2, a 512-Kbyte memory (256K×16 bits) is comprised of sixteen 256K×1 DRAMs, a 128-Kbyte memory (64K×16 bits) is comprised of four 64K×4 DRAMs and their data bus lines (MD15 to MD0) are connected in parallel with each other to constitute a 640-Kbyte memory apparatus (320K×16 bits). The 16-bit data bus (MD15 to MD0) of the memory is connected to a data bus of a microprocessor having a 16-bit data bus width through a buffer (not shown).

It is to be noted that reference numerals 105 and 106 denote 256K×1 parity-bit DRAMs and 107 and 108, 64K×1 parity-bit DRAMs. The DRAMs 105 and 107 correspond to upper 8 bits (odd-numbered byte), and the DRAMs 106 and 108 correspond to lower 8 bits (even-numbered byte). For parity bits, four 1-bit output DRAMs 105 to 108 are employed. However, the parity-bit DRAM may also be comprised of a one 4-bit output DRAM. Since parity bits of the memory apparatus are not directly related to the present invention, further reference thereto is not necessary.

In FIG. 2, a total of twenty 256K DRAMs are employed. With the progression of semiconductor technology, there is a trend to shift from the use of 256K DRAMs to the use of 1M DRAMs. With this trend, manufacturers of personal computers now frequently employ 1M DRAMs. In this connection, a 640-Kbyte memory apparatus comprises a total of eight DRAMs, i.e., four 256K×4 bit, 1-Mbit DRAMs (hereinafter referred to as 256K×4, 1M DRAMs) and four 64K×4, 256K DRAMs, as shown in FIG. 3. More particularly, four 64K×4, 256K DRAMs form a 128-Kbyte memory (64K×16 bit) and four 256K×4, 1M DRAMs 102 form a 512-Kbyte memory (256K×16 bit). These memories are combined to constitute a 640-Kbyte (320K×16 bit) memory apparatus. A 16-bit data bus (MD 15 to MD 0) of the memory is connected via a buffer to the data bus of the microprocessor.

In the memory apparatus shown in FIG. 3, the sixteen 256K×1, 256K DRAMs shown in FIG. 2 are replaced with four 256K×4, 1M DRAMs. However, the four 64K×4, 256K DRAMs in FIG. 2 cannot be replaced with a 1M DRAM. If these DRAMs are replaced with a 1M DRAM, a 64K×16, 1-Mbit DRAM is necessary but such a DRAM is not commercially available. If such a DRAM were available, its cost would be comparatively higher since it would be a special or hybrid type and the number of pin outputs would be large resulting in a large IC package. Since 16 data bus lines would extend from a single package, the amount of noise would be increased and, as a result, stable operation would not be assured. Therefore, nearly all 640-Kbyte memory apparatus for personal computers have the configuration as shown in FIG. 2.

Thus, when a memory apparatus having a 16-bit data bus width is comprised of, e.g., 256K×4 memory units by a conventional method of constituting a memory apparatus, a 512-Kbyte or 1-Mbyte apparatus can be formed, but a 640-Kbyte apparatus is not possible. In order to provide a 640-Kbyte memory apparatus by the conventional approach, four 64K×4, 256K DRAMs are necessary in addition to four 256K×4, 1M DRAMs.

As previously indicated, however, manufacturers of semiconductor memory devices have recently shifted emphasis to the manufacture and sale of 1M DRAMs with an accompanying trend toward the decrease of production quantities of 256K DRAMs. In fact, the production of 256K DRAMs may be terminated by many manufactures in the near future. More particularly, semiconductor memory units of one type tend to be intensively manufactured according to current needs and demand. For this reason, semiconductor memory units other than those which are currently, intensively manufactured cannot be supplied in large quantities, which results in high cost. Therefore, it may become difficult to obtain a sufficient supply of production quantity, high quality 256K DRAMs which will directly affect the production quantities of personal computers. In addition, the cost of 256K DRAMs will also increased. Thus, an important goal for the manufacturers of personal computers in the future is to develop personal computers which do not require 256K DRAMs for memory.

If a memory apparatus can be formed by employing only semiconductor memory units of a single type and capacity, which are currently mass-produced in the largest quantities, a memory apparatus and a personal computer adopting the memory apparatus can be supported at low cost without restricting production quantities of the personal computer.

It is an object of the present invention to provide a memory apparatus which employs semiconductor memory units of one type while also providing a high degree of freedom relative to its total memory capacity, i.e., providing a flexibility wherein its total memory capacity can be formed in relatively small units.

SUMMARY OF THE INVENTION

According to this invention, a memory apparatus comprises $W(1+J/N)$ (words)$\times D$ (bits) configuration employing $M_{N+J}$ semiconductor memory units having $(N+J)$ W (words)$\times B$ (bits) semiconductor memory elements wherein $N=D/B=2^{d-b}$ and J is a positive integer wherein $J<N$; $W=2^w$ and w is a positive integer; and $B=2^b$ where b is zero or a positive integer satisfying $b<d$. More particularly, a W-word address area of each semiconductor memory unit, $M_{N+J}$, is equally divided into P unit address areas, $a_1, a_2, \ldots, a_P$, wherein $P=N.L/J$, wherein P and L are positive integers, and a $W(1+J/N)$-word memory address area is divided into units of $W/P$ words and expressed by a plurality of $(P+L)$ divided memory address areas $A_1, A_2, \ldots, A_{P+L}$. A plurality of sets of N divided unit address areas are formed by selection from all the $P(N+J)$ divided unit address areas, avoiding repetition of semiconductor memory units and each set is provided to correspond to one of the divided memory address areas $A_1, A_2, \ldots, A_{P+L}$.

Thus, according to this invention, the memory capacity can be set in relatively small units, i.e., in units of $W.J/N$ words$\times D$ bits employing only semiconductor memory units of a single type. For example, when a memory apparatus having a 16-bit width is to be constituted from 256K×4, 1M DRAMs, memory apparatus having different memory capacities of 512 Kbytes, 1 Mbyte, 1.5 Mbyte, 2 Mbyte, etc., i.e., apparatus in units of 512 Kbytes, can only be obtained according to the conventional technique. However, according to this invention, memory apparatus having different memory capacities of 512 Kbytes, 640 Kbytes, 768 Kbytes, 896 Kbytes, 1 Mbyte, $(1+\frac{1}{8})$ Mbytes, etc., i.e., apparatus in units of 128 Kbytes ($\frac{1}{8}$ Mbytes), can be realized.

As an example, five 256K×4, 1M DRAMs are employed so that four out of five DRAMs always correspond to access from a microprocessor. Furthermore, a 640-Kbyte memory address space is equally divided into five 128-Kbyte memory address areas and the correspondence between the 128-Kbyte divided memory address areas and four out of the five DRAMs is regularly determined in turn thereby constituting a 640-Kbyte memory apparatus (320 Kwords×16 bits) employing only 1M DRAMs.

Therefore, one 640-Kbyte memory apparatus, which is most popular in the field of personal computers, can be constituted from five 1-Mbit DRAMs, as compared to a total of eight DRAMs, i.e., four 1M DRAMs and four 256K DRAMs for the conventional memory apparatus. Therefore, the memory apparatus of this invention is highly advantageous in terms of overall cost, space relative to memory mounting area, ultimate power consumption and readily available commercial DRAM supply.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1A is a block diagram illustrating connections between a CPU and a memory apparatus according to an embodiment of this invention.

FIG. 1B is a block diagram showing an internal arrangement of the memory apparatus according to the embodiment of this invention.

FIG. 1C is a table setting forth the correspondence between address areas of a microprocessor and DRAMs in the memory apparatus.

FIG. 1D illustrates various I/O terminals of a 256K×4, 1M DRAM.

FIG. 1E illustrates the internal address structure of the DRAM shown in FIG. 1D.

FIG. 1F is a more detailed DRAM/address table relative to the table shown in FIG. 1C.

FIGS. 1G-1 and 1G-2 are circuit diagrams for a control circuit for the address terminals of the DRAMs of FIG. 1D.

FIG. 1H is an illustration of the principle of the memory apparatus of this invention.

FIGS. 2 and 3 are block diagrams illustrating the conventional memory apparatus employed in standard personal computers.

FIG. 4 is an DRAM/address table relative to a second embodiment of this invention.

FIG. 5 is an DRAM/address table relative to a third embodiment of this invention.

FIG. 6 is an DRAM/address table relative to a fourth embodiment of this invention.

FIG. 7 is a table for the purposes of comparing available memory capacities of conventional memory apparatus with memory capacities achievable by the practice of this invention.

DESCRIPTION OF THE PREFERRED EMBODIMENTS

Reference is now made to FIG. 1A which illustrates an embodiment of a personal computer comprising a memory apparatus according to this invention. The data bus width of the memory apparatus 1 according to the present invention is 16 bits. Data bus lines MD15 to MD0 of memory apparatus 1 are connected to a 16-bit data bus (data lines D15 to D0) of microprocessor 2. These memory/data bus lines are connected between memory apparatus 1 and microprocessor 2 via buffer 3.

FIG. 1B illustrates a detailed example of memory apparatus 1 of FIG. 1A. Five 256K×4, 1M DRAMs 102 comprise a 640-Kbyte memory apparatus. The five 1M DRAMs 102 are identified as M1, M2, M3, M4 and M5. Lines MD15 to MD0 comprise a 16-bit memory data bus and, as previously indicated, are connected to microprocessor 2 through buffer 3. Bidirectional buffers 200 in memory apparatus 1 are enabled when their enable terminals $\overline{G}$ are at a low (L) level or state. The data direction of each buffer 200 is determined according to the present value of direction control buffer signal, DIR, relative to each buffer. When the terminal DIR is at a high (H) level or state, each buffer 200 drives data from terminals A (A1, A2, A3 and A4) to terminals B (B1, B2, B3 and B4). When the particular terminal DIR is at a L level or state, corresponding buffer 200 drives data from terminals B to terminals A. When the terminal $\overline{G}$ is at H level or state, corresponding buffer 200 is disabled and terminals A and B are disconnected. The functions of each bidirectional buffer 200 are summarized in Table 2 below.

TABLE 2

| $\overline{G}$ | DIR | Operations of Buffer |
|---|---|---|
| L | L | B (B1 to B4) → A (A1 to A4) |
| L | H | A (A1 to A4) → B (B1 to B4) |
| H | — | A and B are disconnected |

Buffers 200 are identified as BF1, BF2, BF3 and BF4 and signals at the terminals $\overline{G}$ of these buffers are respectively represented by $\overline{G1}$, $\overline{G2}$, $\overline{G3}$ and $\overline{G4}$. The terminals DIR of buffers 200 are commonly connected and are connected to receive signal, $\overline{MEMR}$, at this terminal. The $\overline{MEMR}$ signal reverts to the L level or state when a read command is executed for memory apparatus 1. More particularly, in a memory read mode, buffers 200 drive from the terminals B to the terminals A; in all other modes, buffers 200 drive from the terminals A to the terminals B.

In FIG. 1A, a description about an address bus is omitted. The memory addresses of this embodiment, however, will now be described. For the purposes of this example, it is assumed that memory apparatus 1 is allocated 640 Kbytes from 0000H to 9FFFFH on a memory address space of microprocessor 2. The H appended at the end of an address is a symbol indicating the hexadecimal notation. The 640-Kbyte address space occupied by the memory apparatus 1 is equally divided into five spaces and the five 128-Kbyte address spaces are hereinafter referred to as divided memory address areas $A_1$, $A_2$, $A_3$, $A_4$ and $A_5$. In this embodiment, a 128-Kbyte area from 00000H to 1FFFFH is the area $A_1$; 20000H to 3FFFFH, $A_2$; 40000H to 5FFFFH, $A_3$; 60000H to 7FFFFH, $A_4$ and 80000H to 9FFFFH, $A_5$.

Reference is now made to memory access by microprocessor 2. A specific example is made wherein microprocessor 2 executes memory read access of area $A_1$ (00000H to 1FFFFH). In this example, of five DRAMs, DRAMs M2, M3, M4 and M5 respectively output 4-bit memory data. The remaining DRAM M1 does not respond at all and outputs no memory data. More particularly, DRAM M2 outputs memory data to lines MD11 to MD8, DRAM M3 outputs memory data to lines MD7 to MD4, and DRAM M4 outputs memory data to lines MD3 to MD0. In a memory read mode of area $A_1$, only buffer BF1 of the four buffers BF1, BF2, BF3 and BF4 is enabled ($\overline{G1}$=L, $\overline{G2}$=$\overline{G3}$=$\overline{G4}$=H). In addition, since DIR signal (=$\overline{MEMR}$) of each buffer is at the L level, memory data read out from DRAM M5 is provided as output to lines MD15 to MD12 through buffer BF1. As described above, memory data are read out from DRAMs M5, M2, M3 and M4 onto lines MD15 to MD0. Memory write access of area $A_1$ is executed in the same identical manner as in the memory read access except that the direction of data flow is reversed.

In a memory read mode of the area $A_2$ (20000H to 3FFFFH), the DRAMs M1, M3, M4 and M5 respond, and only the buffer BF2 is enabled ($\overline{G2}$=L, $\overline{G1}$=$\overline{G3}$=$\overline{G4}$=H).

In this case, DRAM M1 outputs data onto lines MD15 to MD12, DRAM M5 outputs data onto lines MD11 to MD8 through buffer BF2, DRAM M3 outputs data onto lines MD7 to MD4, and DRAM M4 outputs data onto lines MD3 to MD0.

Similarly, in a memory read mode of area $A_3$ (40000H to 5FFFFH), four DRAMs, i.e., M1 (MD15 to MD12), M2 (MD11 to MD8), M5 (MD7 to MD4) and M4 (MD3 to MD0) respond. In a memory read mode of area $A_4$ (60000H to 7FFFFH), four DRAMs, i.e., M1 (MD15 to MD12), M2 (MD11 to MD8), M3 (MD7 to MD4) and M5 (MD3 to MD0) respond.

In a memory read mode of area $A_5$, four DRAMs, i.e., M1 (MD15 to MD12), M2 (MD11 to MD8), M3 (MD7 to MD4) and M4 (MD3 to MD0) respond. In this case, all four buffers 200 (BF1 to BF4) are disabled.

As described above, in memory apparatus 1 of FIG. 1B, in response to access from microprocessor 2, four out of the five DRAMs always respond to generate 16-bit memory data. The table illustrated in FIG. 1C summarizes the correspondence between the memory addresses of microprocessor 2 and DRAMs 102 (M1 to M5) and the relationship between the memory addresses of microprocessor 2 with buffers 200 (BF1 to BF4).

With the above mechanisms, a 640-Kbyte memory apparatus (320 Kwords×16 bits) can be achieved with five 256K×4, 1M DRAMs.

Correspondence of DRAMs M1-M5 with the data bus will now be briefly described. In the present invention, only four DRAMs need to correspond to memory address areas of microprocessor 2 and four DRAMs need only have a one-to-one correspondence with the corresponding lines of the 16-bit data bus without overlapping each other. However, if the correspondence is not regular, the number of buffers between the lines MD15 to MD0 and DRAMs M1-M5 is undesirably increased. In the embodiment shown FIG. 1B, the four DRAMs 200 (M1-M4) respectively always correspond to lines MD15 to MD12, MD11 to MD8, MD7 to MD4 and MD3 to MD0. Only DRAM M5 corresponds to one set of lines MD15 to MD12, MD11 to MD8, MD7 to MD4 and MD3 to MD0, depending on the selected memory address area. Therefore, four buffers are required between the DRAM M5 and memory data bus lines MD15 to MD0. For the DRAMs M1 to M4, no buffer is required. In the embodiment shown in FIG. 1B, a total of only four buffers 200 are necessary. The number of required buffers is smallest in this particular embodiment.

Correspondence between internal addresses of each DRAM, particularly relative to a 256K×4, 1M DRAM, and the memory addresses of microprocessor 2 will now be briefly described. FIG. 1D illustrates the pin allocation of the 1M DRAM 102 employed in the embodiment of FIG. 1B, which DRAM is commercially available. The 4-bit data lines of DRAM 102 are indicated by lines I04 to I01 and, in this embodiment, only these data bus lines are connected. MA8 to MA0 designate nine DRAM address bus lines to which nine row addresses and nine column addresses are multiplexed and are provided as input thereto. More particularly, theoretically, 18 addresses are possible as input to DRAM 102. $\overline{RAS}$, $\overline{CAS}$, $\overline{WE}$ and $\overline{OE}$ denote control signals for DRAM 102, which are employed in connection with read/write control.

DRAM 102 of FIG. 1D has a 256 (Kwords)×4 (bits) configuration. Of 256 Kwords, one word is selected by address bus lines MA8 to MA0. The internal address structure of DRAM 102 of FIG. 1D is shown in FIG. 1E. The 256-Kword memory area is divided into four areas and the divided areas are respectively represented by divided element address areas $a_1$, $a_2$, $a_3$ and $a_4$. More specifically, when the internal addresses of the DRAM are represented by 00000H to 3FFFFH, addresses 00000H to 0FFFFH correspond to the area $a_1$; 10000H to 1FFFFH, $a_2$; 20000H to 2FFFFH, $a_3$ and 30000H to 3FFFFH, $a_4$.

As can be seen from FIG. 1C, the five DRAMs M1-M5 correspond to four areas of the divided memory address areas $A_1$-$A_5$ of microprocessor 2. For example, DRAM M1 corresponds to four areas $A_2$, $A_3$, $A_4$ and $A_5$. The divided element address areas $a_1$-$a_4$ have a one-to-one correspondence with the four areas $A_2$, $A_3$, $A_4$ and $A_5$. The correspondence need only be a one-to-one correspondence and various other correspondences may also be utilized. In this embodiment, area $A_2$ corresponds to area $a_2$ of DRAM M1; $A_3$ to $a_3$; $A_4$ to $a_4$ and $A_5$ to $a_1$. Similarly, DRAM M2 corresponds to the four address areas $A_1$ (corresponding to $a_1$ of DRAM M2), $A_3$ ($a_3$), $A_4$ ($a_4$) and $A_5$ ($a_2$). Each of the DRAMs M3, M4 and M5 similarly corresponds to the four address areas $a_1$, $a_2$, $a_3$ and $a_4$ and FIG. 1F summarizes their correspondence. FIG. 1F summarizes the correspondence between the address areas ($A_1$ to $A_5$) of microprocessor 2 and address areas ($a_1$-$a_4$) in DRAMs M1-M5, and the relationship between DRAM data and memory data bus lines (MD15 to MD0).

When microprocessor 2 accesses address area $A_1$, column $A_1$ is vertically checked. DRAM M1 does not respond and the four DRAMs (M2-M5) respond in the manner indicated. This $A_1$ column demonstrates that data in area $a_1$ of DRAM M2 corresponds to lines MD11 to MD8, as indicated by D2; data in area $a_1$ of DRAM M3 corresponds to lines MD7 to MD4, as indicated by D3; data in area $a_1$ of DRAM M4 corresponds to lines MD3 to MD0, as indicated by D4; and data in area $a_1$ of DRAM M5 corresponds to lines MD15 to MD12, as indicated by D1. The same equally applies to the columns for $A_2$-$A_5$.

FIGS. 1G-1 and 1G-2 illustrate a circuit for controlling address terminals MA8 to MA0 of DRAMs M1-M5. Address bus lines CA19-CA1 of microprocessor 2 are multiplexed in response to a control signal MPX to provide addresses for a respective DRAM. When MPX=L, the row address is fetched in the respective DRAM and when MPX=H, the column address is fetched in the respective DRAM. Lines corresponding to lower 8 bits of an address (MA70-MA00) are commonly connected to all the DRAMs. However, lines corresponding to the MSBs (most significant bits) are connected to different respective DRAMs. More particularly, line MA81 is connected to DRAMs M1 and M5, line MA82 is connected to DRAM M2, line M83 is connected to DRAM M3, and line MA84 is connected to DRAM M4.

In the foregoing embodiment, an example has been provided wherein a 640-kbyte memory apparatus is constituted by five 256K× 4, 1M DRAMs. However, as previously indicated, the present invention is not limited to this particular arrangement.

FIG. 1H generically illustrates the basic principle of this invention. In this figure, the upper portion shows the standard commercially available memory configuration comprising a capacity of (N+J)W words by B bits employing readily available memory units, such as 128K×4 bit or 256K×4 bit memory units. The lower portion in this figure shows these combined memory units reorganized or reconfigured relative to memory address areas to produce a total memory unit having a desired, predetermined memory configuration and bus or bit width with a capacity of W(1+J/N) words×D bits. Relative to the parameters in FIG. 1H, $M_1$-$M_{N+J}$ represent the number of presently or commercially available semiconductor memory units necessary for the memory apparatus of this invention in order to achieve a reconfigured allocation of word memory address areas, $A_1$-$A_{P+L}$, conforming to the required memory data bus width and providing the required word capacity, indicated in the lower portion of FIG. 1H. "W" represents the word size of the presently or commercially available memory units, such as 128K, 25K or 1 Meg. "B" represents the bit width of such presently or commercially available memory units. "D" represents the bit width or bus width communication link between, for example, a 16 bit or 32 bit processor and the corresponding bit or bus width of the memory apparatus. "N" is a fixed number representative of the number of memory units of the memory apparatus to achieve a given D bit width. "J" is a flexible number that is less than N and provides for an increase in the memory capacity of the fixed portion, W(N), of the memory apparatus to provide the desired reconfiguration in the reallocation of memory address areas necessary to achieve an addressable capacity of $W(1+J/N)$ words$\times$D bits with N+J memory units. In this connection, "J" is usually a small positive integer, such as, 1, 2, or 3, etc. but always below the number of N memory units. "L" is a flexible number, the value of which determines the capacity of the semiconductor element address areas and, in particular, an increase in the capacity of the defined element address areas of the particular memory units. In this connection, "L" is usually a small positive integer, such as, 1, 2, etc. "$a_1$-$a_p$" are the semiconductor memory element address areas of memory units $M_1$-$M_{N+J}$. "P" is the total number of semiconductor element address areas which is determined from the number of memory units N+J and the determined flexible increase in their capacity, L, to achieve an $W(1+J/N)$ (words)$\times$D (bits) configuration.

Thus, memory apparatus 1 comprises $W(1+J/N)$ (words)$\times$D (bits) configuration employing $M_{N+J}$ semiconductor memory units having (N+J) W (words)$\times$B (bits) semiconductor memory elements wherein (1) $N=D/B=2^{d-b}$ and J is a positive integer wherein J<N; (2) $W=2^w$ and w is a positive integer; and (3) $B=2^b$ where b is zero or a positive integer satisfying b<d. More particularly, a W-word address area of each semiconductor memory unit, $M_{N+J}$, is equally divided into P element address areas, $a_1$, $a_2$, ..., $a_p$, wherein the number, P, of such element address areas is determined by $P=N\cdot L/J$, wherein P and L being positive integers, and a $W(1+J/N)$-word memory address area is divided in units of W/P words and represented by a plurality of (P+L) memory address areas, $A_1$, $A_2$, ..., $A_{P+L}$. A plurality of sets, each comprising a combination of N divided semiconductor memory element address areas, $a_1$, $a_2$, ..., $a_p$, are selected from the P(N+J) divided element address areas, avoiding any repetition of the semiconductor memory units, and each such set is designated as one of the divided memory address areas $A_1$, $A_2$, ..., $A_{P+L}$. In the embodiment shown in FIGS. 1A-1G, the parameters relative to FIG. 1H are as follows: w=18; $W=2^w=256K$; b=2; $B=2^b=4$; n=2; $N=2^n=4$; J=1; $D=2^n\times 2^b=16$; L=1; and $P=N\cdot L/J=4$.

Reference is now made to a second embodiment of this invention shown in FIG. 4 wherein a 768-Kbyte memory apparatus (384 Kwords$\times$16 bits) comprises six 256K$\times$4, 1M DRAMs. The second embodiment of FIG. 4 corresponds to the first embodiment in FIG. 1F.

M1 to M6 designate six DRAMs (256K$\times$4 configuration) M1-M6 are provided with 128-Kbyte address areas $A_1$-$A_6$. Although address areas $A_1$ to $A_5$ are the same as those in the first embodiment, area $A_6$ is allocated in E0000H to FFFFFH. More particularly, in this embodiment, the 768-Kbyte address areas are not continuous. This implies that the address areas of the memory apparatus need not always be continuous in the memory apparatus of this invention. In FIG. 4, D1-D4 and $a_1$-$a_4$ have the same connotation and meaning as those expressed in FIG. 1F.

In this embodiment, four out of the six DRAMs always correspond to address areas $A_1$-$A_6$. DRAMs M1-M6 correspond to four out of six address areas. As for the correspondence with the data bus, DRAM M1 always corresponds to D1 (MD15 to MD12); M2 with D2 (MD11 to MD8); M3 with D3 (MD7 to MD4); and M4 with D4 (MD3 to MD0). On the other hand, DRAM M5 corresponds to D1 in association with address areas $A_1$ and $A_2$ and corresponds to D3 in association with address areas $A_3$ and $A_4$. DRAM M6 corresponds to D2 in association with areas $A_1$ and $A_2$, and corresponds to D4 in association with areas $A_3$ and $A_4$. A detailed circuit arrangement, similar to FIG. 1G, is omitted here as it can easily understood from the above description as well as from the example of the first embodiment.

In this embodiment, the parameters relative to FIG. 1H are as follows: W=18; $W=2^w=256K$; b=2, $B=2^b=4$; n=2; $N=2^n=4$; J=2; $D=2^n\times 2^b=16$; L=2 and $P=N\cdot L/J=4$.

Reference is now made to a third embodiment shown in FIG. 5 wherein a 768-Kbyte memory apparatus (384 Kwords$\times$16 bits) comprises six 256K$\times$4, 1M DRAMs in the same manner as illustrated in the second embodiment of FIG. 4. The primary difference between the third and second embodiments is the manner of dividing the internal addresses of the 1M DRAM as a semiconductor memory element. In the second embodiment, the 256-Kword element internal address space is divided into four 64-Kword address areas $a_1$ to $a_4$ in the same manner as provided in the first embodiment. In the third embodiment, however, the 256-Kword element internal address space is equally divided into two 128-Kword areas $a_1$ and $a_2$. The address space of the memory is accordingly divided into three address areas $A_1$ to $A_3$ in units of 128 Kwords. The difference between the third and second embodiments is illustrated by parameters shown in FIG. 1H, i.e., by the values of the numbers of divisions, P, of the internal address space of the semiconductor memory element, and, hence, the values L differ from each other. More particularly, in the second embodiment, L=2 and P=NL/J=4, while in the third embodiment, L=1 and P=2. The other parameters are the same as those in the second embodiment.

Reference is now made to a fourth embodiment of this invention, shown in FIG. 6, wherein a 896-Kbyte memory apparatus (448 Kwords$\times$16 bits) comprises seven 256K$\times$4, 1M DRAMs. The parameters relative to FIG. 1H for this embodiment are as follows: W=18; $W=2^w=256K$; b=2; $B=2^b=4$; n=2; $N=2^n=4$; J=3; $D=2^n\times 2^b=16$; L=1 and $P=N\cdot L/J=4$. The principle of this embodiment is the same as that in the first to third embodiments so that a detailed description thereof is not necessary but is clearly evident from a simple examination of FIG. 6.

FIG. 7 is a comparison table illustrating different available memory capacities according to the basic memory configuration approach of this invention in comparison with those of conventional apparatus when employing semiconductor memory units all of a single type.

While the invention has been described in conjunction with several specific embodiments, it is evident to those skilled in the art that many further alternatives, modifications and variations will be apparent in light of the forgoing description. For example, according to the present invention, a memory apparatus may be comprised of semiconductor memory units of same, single type and such memory apparatus may be connected in parallel with another memory apparatus if the number of bits of the memory units are the same, i.e., they have the same data bit width. In such a case, the other memory apparatus may be one comprised either of exclusively semiconductor memory units of one type or may be comprised of an existing memory apparatus comprised of a plurality of types of semiconductor memory units. Thus, the invention described herein is intended to embrace at such alternatives, modifications, applications and variations as fall within the spirit and scope of the appended claims.

What is claimed is:

1. A memory apparatus having a data bus of D-bit wide and a memory configuration of $W(1+J/N)$ words×D bits, the memory apparatus comprising:

(N+J) memory units, each having a W words×B bits configuration; and wherein $D=2^d$, and d is a positive integer, $W=2^w$, and w is a positive integer, $B=2^b$, b is zero or a positive integer and $b<d$, J is a positive integer and $J<N$, and $N=D/B=2^{d-b}$.

2. A memory apparatus having a data bus of D-bit wide and a memory configuration of $W(1+J/N)$ words×D bits, the memory apparatus comprising:

(N+J) memory units, each having a W words×B bits configuration and being equally divided into P element address areas, $a_1, a_2, \ldots, a_p$;

wherein $D=2^d$, and d is a positive integer, $W=2^w$, and w is a positive integer, $B=2^b$, b is zero or a positive integer and $b<d$, J is a positive integer and $J<N$, $N=D/B=2^{d-b}$, and $P=N\cdot L/J$ and P and L are positive integers; and wherein said $W(1+J/N)$ words×D bits memory configuration is divided into (P+L) memory address areas $A_1, A_2, \ldots, A_{P+L}$, so that each memory address area comprises N element address areas, only one of which comes from a corresponding memory unit.

3. A memory apparatus according to claim 1 or 2 wherein N memory units are designated and said D-bit data bus is divided into N sections each being B-bit wide, and wherein each of said N designated memory units corresponds to one of said N sections without overlapping each other.

4. A memory apparatus according to claim 3, further comprising a plurality of bidirectional buffers controllable by switching between their respective ON/OFF states and between their respective directions of data flow and wherein each of the remaining J memory units not included in said N designated memory units is coupled to selected ones of said N sections of said D-bit data bus through said bidirectional buffers so as to organize the memory apparatus into said memory configuration of $W(1+J/N)$ words×D bits.

5. A memory apparatus according to claim 2, further comprising means for coupling to another memory apparatus having a D-bit data bus.

6. A memory apparatus according to claim 2 wherein $D=16$, $d=4$, $W=256K$, $w=18$, $B=4$, $b=2$, $N=4$, $n=2$, $J=1$, $L=1$, $P=4$, and said memory configuration has 640 Kbytes.

7. A memory apparatus having a data bus of D-bit wide and a memory configuration of $W(1+J/N)$ words×D bits, the memory apparatus comprising:

(N+J) commercially available semiconductor memory units each having a W words×B bits configuration and wherein $D>B$ and N is a fixed number representative of a number of memory units necessary for achieving a configuration having a data bus of D-bit wide and J is a flexible number less than N and representative of an additional number of memory units necessary for achieving said memory configuration of $W(1+J/N)$ words×D bits;

wherein each memory unit is divided into P memory element address areas, $a_1, a_2, \ldots, a_p$, each having W/P words, wherein $P=N\cdot L/J$, L is a flexible number; and wherein said $W(1+J/N)$ words×D bits memory configuration is divided into (P+L) memory address areas $A_1, A_2, \ldots, A_{P+L}$, so that each memory address area comprises an addressable set of N element address areas, only one of which comes from a corresponding memory unit, wherein L represents an additional number of memory address areas in said memory configuration attributable to J memory units.

8. A memory apparatus according to claim 2, wherein said (N+J) memory units are commercially available semiconductor memory units.

* * * * *